United States Patent
Carswell et al.

(10) Patent No.: US 9,153,451 B2
(45) Date of Patent: Oct. 6, 2015

(54) METHOD OF FORMING A PLANAR SURFACE FOR A SEMICONDUCTOR DEVICE STRUCTURE, AND RELATED METHODS OF FORMING A SEMICONDUCTOR DEVICE STRUCTURE

(71) Applicant: Micron Technology, Inc., Boise, ID (US)

(72) Inventors: Andrew Dennis Watson Carswell, Boise, ID (US); Wayne Hai-Wei Huang, Boise, ID (US); Siddartha Kondoju, Boise, ID (US); Jin Lu, Boise, ID (US); Suresh Ramakrishnan, Boise, ID (US); Kozaburo Sakai, Boise, ID (US); Sony Varghese, Boise, ID (US); Andrey V. Zagrebelny, Eagan, MN (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 13/712,635

(22) Filed: Dec. 12, 2012

(65) Prior Publication Data

US 2014/0162455 A1   Jun. 12, 2014

(51) Int. Cl.
*H01L 21/302* (2006.01)
*H01L 21/461* (2006.01)
*H01L 21/306* (2006.01)
*H01L 21/3105* (2006.01)
*H01L 21/321* (2006.01)

(52) U.S. Cl.
CPC .... *H01L 21/30625* (2013.01); *H01L 21/31053* (2013.01); *H01L 21/31058* (2013.01); *H01L 21/32125* (2013.01)

(58) Field of Classification Search
USPC ............................... 216/88–91; 438/690–693
See application file for complete search history.

(56) References Cited

U.S. PATENT DOCUMENTS

| | | |
|---|---|---|
| 5,968,239 A | 10/1999 | Miyashita et al. |
| 6,090,446 A | 7/2000 | Nakashima et al. |
| 6,896,590 B2 | 5/2005 | Minamihaba et al. |
| 2004/0116048 A1* | 6/2004 | Akedo ............................ 451/38 |
| 2007/0269987 A1 | 11/2007 | Nakano et al. |
| 2009/0218639 A1 | 9/2009 | Beyer et al. |
| 2010/0003904 A1* | 1/2010 | Duescher ...................... 451/259 |
| 2011/0049637 A1 | 3/2011 | Wiatr et al. |
| 2011/0275168 A1 | 11/2011 | Davis et al. |
| 2012/0025318 A1 | 2/2012 | Richter et al. |
| 2012/0211844 A1 | 8/2012 | Schloesser et al. |
| 2012/0217587 A1 | 8/2012 | Wang |

* cited by examiner

*Primary Examiner* — Allan Olsen
*Assistant Examiner* — Margaret D Klunk
(74) *Attorney, Agent, or Firm* — TraskBritt

(57) ABSTRACT

A method of forming a planar surface for a semiconductor device structure. The method comprises forming a particle film comprising a plurality of discrete particles on a non-planar surface of a semiconductor device structure. The semiconductor device structure is subjected to at least one chemical-mechanical polishing process after forming the particle film on the non-planar surface of the semiconductor device structure. Methods of forming a semiconductor device structure are also described.

22 Claims, 6 Drawing Sheets

METHOD OF FORMING A PLANAR SURFACE FOR A SEMICONDUCTOR DEVICE STRUCTURE, AND RELATED METHODS OF FORMING A SEMICONDUCTOR DEVICE STRUCTURE

TECHNICAL FIELD

Embodiments of the disclosure relate to the field of semiconductor device design and fabrication. More specifically, the disclosure, in various embodiments, relates to methods of forming a planar surface for a semiconductor device structure, and to related methods of forming semiconductor device structures.

BACKGROUND

During integrated circuit fabrication, one or more chemical-mechanical polishing (CMP) processes may be utilized to form planar surfaces for a semiconductor device structure. In a conventional CMP process, a material having a non-planar topography is contacted with a rotating polishing pad in the presence of a polishing slurry. The polishing slurry includes a chemically reactive material and an abrasive material (e.g., silica, alumina, ceria, etc.). The chemically reactive material chemically modifies at least some of the material to promote removal of the material by the abrasive material and the rotating polishing pad, and may also remove some of the material. The abrasive material and the rotating polishing pad physically modify and remove at least some portions of the material not removed by the chemically reactive material.

The efficiency of a CMP process depends largely on the ability of the CMP process to remove elevated regions of the material faster than recessed regions of the material. Removing the elevated regions of the material faster than the recessed regions of the material reduces the amount of the material that must initially be present to form a planar surface, and reduces the risk of dishing. Accordingly, it is generally desirable to remove elevated regions of the material without substantially reducing a thickness of the recessed regions of the material.

One method commonly utilized to remove elevated regions of a material faster than recessed regions of the material includes incorporating protective additives (e.g., polymers, surfactants, etc.) into the polishing slurry. During the CMP process, the protective additives weakly adhere to the surfaces of the material, allowing the protective additives to be easily removed from the elevated regions of the material while providing some protection to the recessed regions of the material. However, as with the elevated regions of the material, the polishing pad and the abrasive material of the polishing slurry can remove the weakly adhered protective additives from the recessed regions of the material, limiting the protection provided by the protective additives. For example, physical removal of protective additives from recessed regions of the material frequently occurs when the recessed regions of the material are relatively large (e.g., have a lateral dimension of greater than or equal to about 0.5 micrometer).

Another method commonly utilized to remove elevated regions of a material faster than recessed regions of the material includes forming a continuous, solid film over the surfaces of the material prior to performing the CMP process. The solid film strongly adheres to the surfaces of the material, and is generally substantially non-reactive with the etchant of the polishing slurry. Consequently, the solid film can substantially limit or prevent removal of the recessed regions of the material. However, such methods can be complex and costly, requiring multiple processing acts and/or multiple processing materials. For example, after forming the solid film, an initial CMP process (e.g., including a polishing slurry selective to the solid film) can be used to remove portions of the solid film on the elevated regions of the material, followed by another CMP process (e.g., including a different polishing slurry selective to the material) to remove the elevated regions of the material, followed by yet another CMP process to remove the solid film on the recessed regions of the material. In addition, as the solid film is strongly adhered to the surfaces of the material, removing the solid film may require significant downward force, applying undesirable stress on the relatively fragile semiconductor device structure.

Yet another method commonly utilized to remove elevated regions of a material faster than recessed regions of the material includes embedding at least some of the abrasive particles to be used in the polishing slurry in the rotating polishing pad. During the CMP process, the abrasive particles embedded in the rotating polishing pad are released in a controlled manner to gradually remove the elevated regions of the material while limiting removal of the recessed regions of the material. However, such methods can have limited applicability at least due to material selectivity challenges, and can have an undesirably slow material removal rate.

It would, therefore, be desirable to have an improved method of forming a planar surface for a semiconductor device structure to overcome one or more of the above problems.

DETAILED DESCRIPTION

Figure 1A:
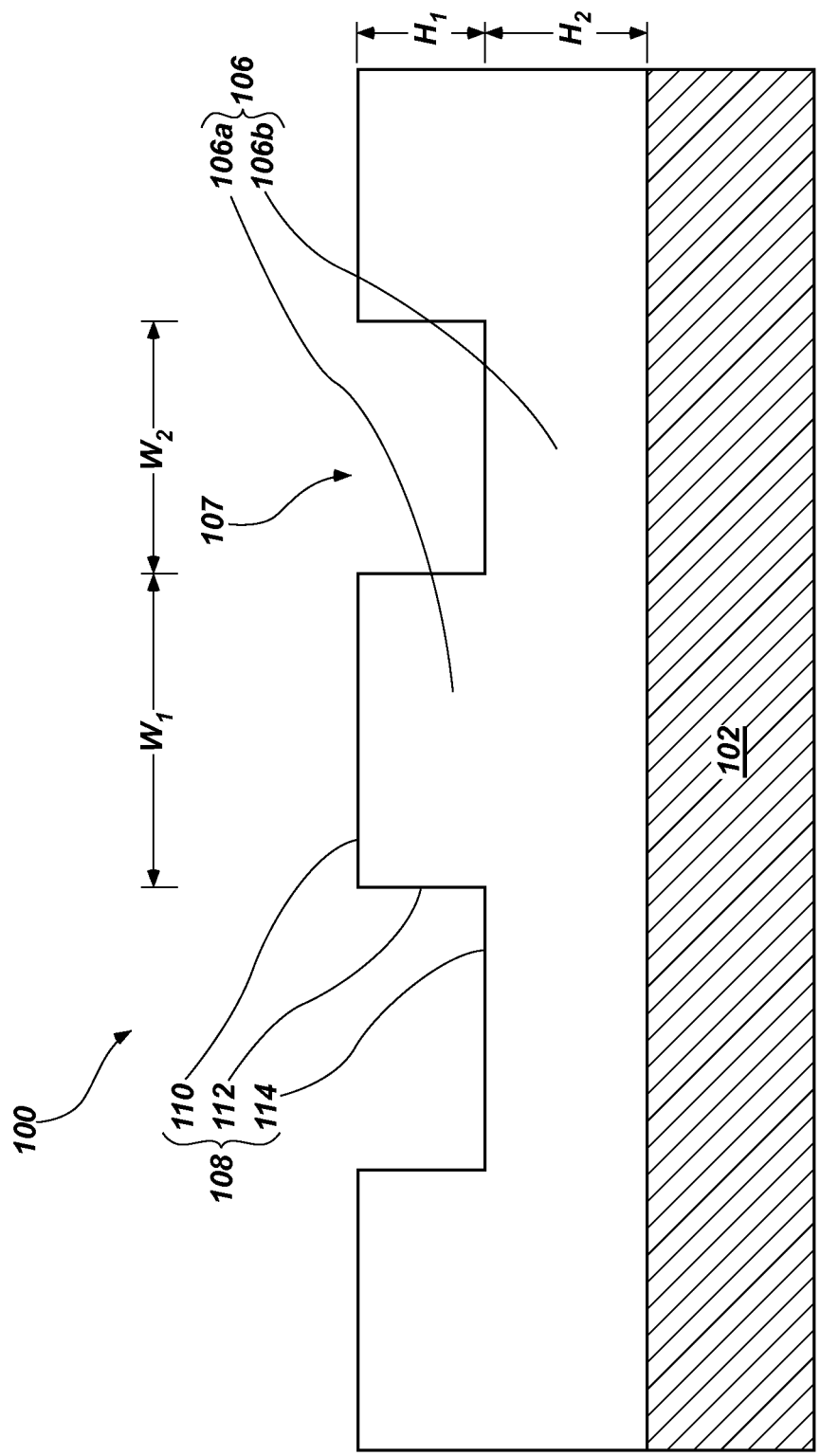
FIGS. 1A through 1C are partial cross-sectional views of a semiconductor device structure and illustrate various stages of a method of forming a planar surface for the semiconductor device structure in accordance with embodiments of the disclosure.

Methods of forming a planar surface for a semiconductor device structure are disclosed, as are methods of forming semiconductor device structures. In some embodiments, forming a planar surface for a semiconductor device structure includes forming a particle film on a non-planar surface of the semiconductor device structure. The particle film may include a plurality of discrete particles directly attached to the non-planar surface of the semiconductor device structure. After forming the particle film on the non-planar surface of the semiconductor device structure, the semiconductor device structure may be subjected to at least one CMP process to form the planar surface. Fondling the particle film on the non-planar surface of the semiconductor device structure before performing the CMP process may protect recessed regions of the semiconductor device structure from removal during the CMP process, facilitating improved planarization efficiency relative to many conventional processes. In addition, the particle film may be more easily removed from the semiconductor device structure than many conventional films (e.g., solid films), decreasing processing complexity, processing costs (e.g., time, energy, materials), and stress-related damage to the semiconductor device structure as compared to other, conventional processes.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the disclosure are described in detail below. Additional acts to form the complete semiconductor device from semiconductor device structures may be performed by conventional fabrication techniques. Also note, any drawings accompanying the present application are for illustrative purposes only, and are thus not drawn to scale. Additionally, elements common between figures may retain the same numerical designation.

As used herein, relational terms, such as "first," "second," "top," "bottom," "upper," "lower," "over," "under," etc., are used for clarity and convenience in understanding the disclosure and accompanying drawings and does not connote or depend on any specific preference, orientation, or order, except where the context clearly indicates otherwise.

As used herein, the term "substantially," in reference to a given parameter, property, or condition, means to a degree that one of ordinary skill in the art would understand that the given parameter, property, or condition is met with a small degree of variance, such as within acceptable manufacturing tolerances.

As used herein, the term "substrate" means and includes a base material or construction upon which additional materials are formed. The substrate may be a semiconductor substrate, a base semiconductor layer on a supporting structure, a metal electrode or a semiconductor substrate having one or more layers, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Figure 1B:
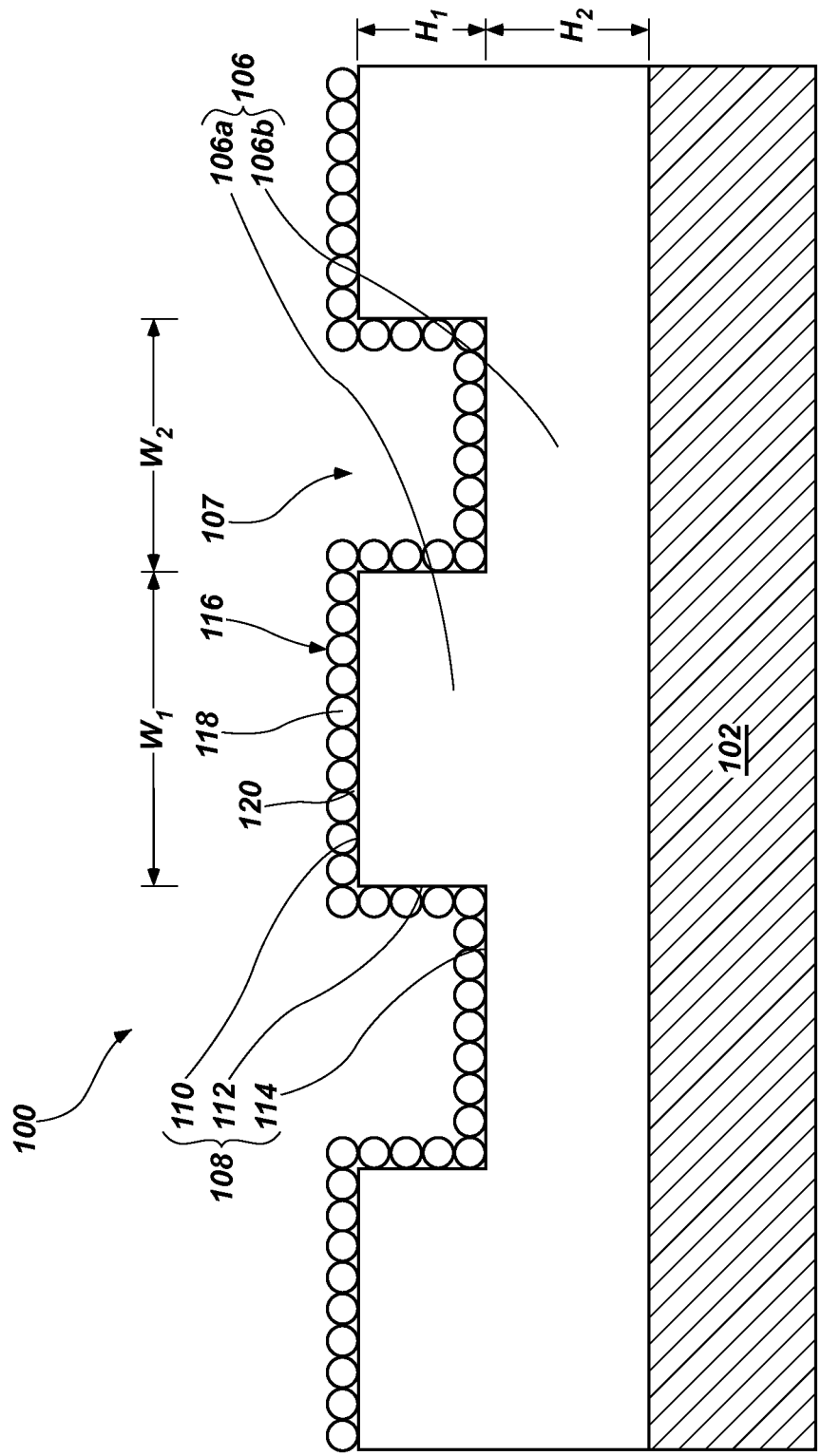
Figure 1C:
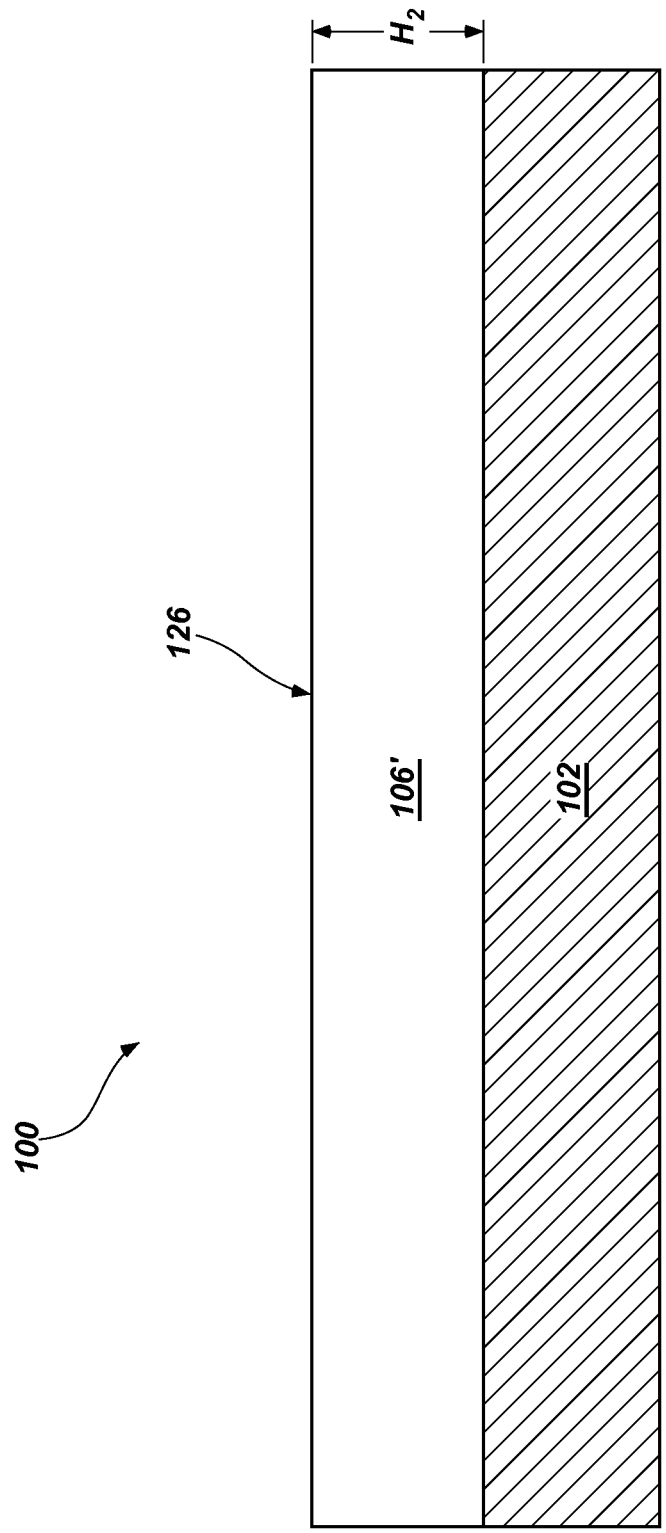

FIGS. 1A through 1C, are simplified partial cross-sectional views illustrating embodiments of a method of forming a planar surface for a semiconductor device structure. As used herein, the term "planar" means substantially planar. With the description as provided below, it will be readily apparent to one of ordinary skill in the art that the methods described herein may be used in various applications. In other words, the methods of the disclosure may be used whenever it is desired to form a planar surface for at least one material having a non-planar topography.

Referring to FIG. 1A, a semiconductor device structure 100 may include a non-planar surface 108. As depicted in FIG. 1A, the non-planar surface 108 may include, for example, exposed surfaces of a material 106 overlying a substrate 102. The material 106 may be a dielectric material, a conductive material, or a semiconductive material. For example, the material 106 may be formed of and include a dielectric material, such as at least one of silicon dioxide (SiO$_2$), silicon oxynitride (SiON), silicon nitride (Si$_3$N$_4$), another dielectric oxide material, and a dielectric polymer material. As another example, the material 106 may be formed of and include a conductive material, such as at least one of a metal, a metal alloy, a conductive oxide material (e.g., a conductive metal oxide), and a conductive polymer material. As another example, the material 106 may be formed of and include a semiconductive material, such as at least one of silicon-germanium (Si$_{1-x}$Ge$_x$, where x is, for example, a mole fraction between 0.2 and 0.8), germanium (Ge), gallium arsenide (GaAs), gallium nitride (GaN), and indium phosphide (InP).

The material 106 may have a non-planar topography. For example, the material 106 may include at least one elevated region 106a and at least one recessed region 106b. As depicted in FIG. 1A, in some embodiments, the material 106 includes a plurality of elevated regions 106a and a plurality of recessed regions 106b, wherein the plurality of elevated regions 106a and plurality of recessed regions 106b define a plurality of trenches 107. The at least one elevated region 106a and the at least one recessed region 106b may each have a desired size and shape. For example, the elevated region 106a may have a desired width W$_1$ and a desired height H$_1$, and the recessed region 106b may have a desired width W$_2$ and a desired height H$_2$. In some embodiments, the width W$_2$ of the recessed region 106b is greater than or equal to about 0.5 micrometer (µm), such as greater than or equal to about 1 µm. The size and shape of each of the elevated region 106a and the recessed region 106b may at least partially define the non-planar surface 108 of the material 106. For example, as shown in FIG. 1A, the non-planar surface 108 of the material 106 may include a top surface 110 of the elevated region 106a, at least one side surface 112 of the elevated region 106a, and a top surface 114 of the recessed region 106b.

The semiconductor device structure 100, including each of the substrate 102 and the material 106, may be formed using conventional processes and equipment (not shown), which are not described in detail herein.

Referring to FIG. 1B, a particle film 116 may be foamed on the non-planar surface 108 of the semiconductor device structure 100. For example, the particle film 116 may substantially conform to and extend substantially continuously across the exposed surfaces of the material 106 (e.g., the top surface 110 of the elevated region 106a, the side surface 112 of each of the elevated region 106a, and the top surface 114 of the recessed region 106b). While the particle film 116 may be formed substantially continuously over the non-planar surface 108, the particle film 116 is not a solid film. Instead, the particle film 116 includes discrete particles 118, with interstitial spaces 120 between the discrete particles 118 and the non-planar surface 108 of the semiconductor device structure 100. In additional embodiments, the particle film 116 may be non-conformal and discontinuous across the non-planar surface 108 of the semiconductor device structure 100. For example, the particle film 116 may be at least partially absent from at least one of the exposed surfaces of the material 106 (e.g., the side surface 112 of the elevated region 106a). In some embodiments, the particle film 116 may substantially continuously extend across the top surface 114 of the recessed region 106b of the material 106 to substantially protect the recessed region 106b of the material 106 during a subsequent CMP process, as described in further detail below.

The particle film 116 may be formed of and include a plurality of discrete particles 118 on the non-planar surface 108 of the semiconductor device structure 100. The plurality of discrete particles 118 may be directly attached to the non-planar surface 108 through at least one of covalent interactions and non-covalent interactions. In some embodiments, the plurality of discrete particles 118 is directly attached to the non-planar surface 108 through non-covalent interactions. Suitable non-covalent interactions include, but are not limited to, electrostatic interactions (e.g., ion-ion, ion-dipole, or dipole-dipole), coordinative bonding (e.g., metal-ligand), hydrogen bonding, π-π stacking interactions, and van der Waals forces. Accordingly, the particle film 116 may be attached to the non-planar surface 108 without use of a binder material. In some embodiments, the plurality of discrete particles 118 are attached to the non-planar surface 108 through electrostatic interactions. Adjacent particles of the plurality of discrete particles 118 may be in physical contact with one another, and may also be attached to one another through at least one of covalent interactions and non-covalent interactions (e.g., electrostatic interactions, coordinative bonding, hydrogen bonding, π-π stacking interactions, van der Waals forces, etc.).

Each of the plurality of discrete particles 118 may be formed of and include at least one material that is compatible with the material 106 and with components of a CMP slurry (described in further detail below) used to polish the material 106. As used herein, the term "compatible" means that a material does not react, decompose, or absorb another material in an unintended way, and also that the material does not impair the chemical and/or mechanical properties of the another material in an unintended way. Each of the plurality of discrete particles 118 may include, for example, at least one of a polymer material, a crystalline material, an organic material, an inorganic material, a semiconductor material, a metallic material, a magnetic material, and a ceramic material. Each of the plurality of discrete particles 118 may be the same, or at least one of the plurality of discrete particles 118 may be different than at least one other of the plurality of discrete particles 118.

Each of the plurality of discrete particles 118 may be non-abrasive. As used herein, the term "non-abrasive" means that a material does not substantially mar, scratch, gouge, or remove the non-planar surface 108 of the semiconductor device structure 100. For example, at least a surface of each the plurality of discrete particles 118 may be formed of and include a non-abrasive material, such as a non-abrasive polymer material. In one embodiment, the discrete particles 118 are formed from the non-abrasive polymer material. Suitable non-abrasive polymer materials include, but are not limited to, acrylic polymers and copolymers (e.g., polyacrylamide, poly(alkyl cyanoacrylate), poly(ethylene-vinyl acetate), etc.), carboxyvinyl polymers, latex, polyamide, poly(adipyl-L-lysine), polyarylsulfone, polycarbonate, polydimethylsiloxane, polyester, polyglutamic acid, polyglycolic acid, polyimide, polylactic acid, polylysine, poly(methylmethacrylate), poly(methyl vinyl ether-maleic anhydride), polyoxyethylene, polystyrene, poly(styrene-acrylonitrile), polyterephthalamide, poly(terephthaloyl-L-lysine), polyvinyl acetate phthalate, poly(vinyl alcohol), and polyvinylpyrrolidone. In some embodiments, each of the plurality of discrete particles 118 is formed of and includes polystyrene or latex. The non-abrasive properties of the plurality of discrete particles 118 may prevent, by substantially limiting, the plurality of discrete particles 118 from recessing the non-planar surface 108 (e.g., during formation of the particle film 116, and/or during removal of the particle film 116).

In additional embodiments, at least some of the plurality of discrete particles 118 may be abrasive. For example, at least a surface of one or more of the plurality of discrete particles 118 may be formed of and include an abrasive material, such as alumina, silica, titania, ceria, zirconia, germania, magnesia, a silicon carbide, a nitride, diamond, garnet, a ceramic abrasive material, or a combination thereof. In some embodiments, at least some of the plurality of discrete particles 118 are formed of and include silica or ceria.

Each of the plurality of discrete particles 118 may be a particle formed of and including a single material, or at least one of the plurality of discrete particles 118 may be a composite particle. As used herein, the term "composite particle" means a particle including at least two constituent materials that remain distinct on a micrometric level while forming a single particle. The composite particle may, for example, include a core of a first material (e.g., at least one of a polymer material, a crystalline material, an organic material, an inorganic material, a semiconductor material, a metallic material, a magnetic material, or a ceramic material) at least partially encapsulated by a shell of a second material (e.g., at least one of a different polymer material, crystalline material, organic material, inorganic material, semiconductor material, metallic material, magnetic material, or ceramic material). By way of non-limiting example, the composite particle may include a non-abrasive polymer shell (e.g., polystyrene, latex, etc.) substantially encapsulating a core of a different material (e.g., metal, metal oxide, ceramic, a different polymer, etc.).

A surface of each of the plurality of discrete particles 118 may be modified to facilitate or enhance the interactions (e.g., covalent interactions, and/or non-covalent interactions) between the plurality of discrete particles 118 and the non-planar surface 108 of the semiconductor device structure 100. For example, the surface of one or more of the plurality of discrete particles 118 may be modified with at least one functional group that enhances electrostatic interactions between the plurality of discrete particles 118 and the non-planar surface 108. The functional groups may be selected based upon material characteristics of the material 106 and of a CMP slurry used to form a planar surface for the semiconductor device structure 100. For example, the functional groups may be selected to facilitate interactions between the plurality of discrete particles 118 and the non-planar surface 108, and to increase adhesion strength between the plurality of discrete particles 118 and the non-planar surface 108 upon exposure to the CMP slurry. The functional groups may be charged functional groups or uncharged functional groups. If the surface of the discrete particles 118 includes charged functional groups, the discrete particles 118 may have an overall charge, such as a positive charge or a negative charge, or the discrete particles 118 may be neutral if an equal number of positive charge and negative charge functional groups are present. Each of the plurality of discrete particles 118 may have substantially the same surface modification, the surface modification of at least one of the plurality of discrete particles 118 may be different than the surface modification of at least one other of the plurality of discrete particles 118, or at least one of the plurality of discrete particles 118 may have substantially no surface modification. In additional embodiments, at least a portion of the non-planar surface 108 of the semiconductor device structure 100 (e.g., at least the top surface 114 of the recessed region 106b of the material 106) may be modified to facilitate or enhance the interactions between the plurality of discrete particles 118 and the portion of the non-planar surface 108 of the semiconductor device structure 100.

Each of the plurality of discrete particles 118 may be of a desired size. The plurality of discrete particles 118 may be, for example, a plurality of discrete nanoparticles. As used herein the term "nanoparticle" means and includes a particle having an average particle width or diameter of about 500 nanometers (nm) or less. By way of non-limiting example, each of the plurality of discrete particles 118 may have a diameter within a range of from about 3 nm to about 250 nm. In addition, each of the plurality of discrete particles 118 may be of a desired shape, such as at least one of a spherical shape, a hexahedral shape, an ellipsoidal shape, a cylindrical shape, a conical shape, or an irregular shape. In some embodiments, each of the plurality of discrete particles 118 has a substantially spherical shape. The size and shape of each of the plurality of discrete particles 118 may be selected based on the topography of the non-planar surface 108 of the semiconductor device structure 100. For example, at least some of the plurality of discrete particles 118 may be configured (e.g., sized and shaped) to fit within at least one trench 107 between adjacent elevated regions 106a of the material 106. Depending upon the topography of the non-planar surface 108 and the size and shape characteristics of the plurality of discrete particles 118, at least some of the plurality of discrete particles 118 may be absent from one or more portions of the non-planar surface 108. For example, if the plurality of discrete particles 118 includes particles having dimensions larger than the dimensions of the trench 107 between the adjacent elevated regions 106a of the material 106, such particles may be absent from one or more surfaces of the material 106 within the trench 107. Thus, the discrete particles 118 may be selectively formed on desired regions of the material 106 by appropriately selecting their particle size. The plurality of discrete particles 118 may be monodisperse, wherein each of the plurality of discrete particles 118 has substantially the same particle size and particle shape, or may be polydisperse, wherein the plurality of discrete particles 118 includes a range of particle sizes and/or particle shapes.

The particle film 116 may include a homogeneous distribution of the plurality of discrete particles 118, or may include a heterogeneous distribution of the plurality of discrete particles 118. For example, if each of the plurality of discrete particles 118 has substantially the same size, shape, and material type, the particle film 116 may include a homogeneous distribution of the plurality of discrete particles 118, wherein the size, shape, and material type of each of the plurality of discrete particles 118 is substantially the same throughout the dimensions of the particle film 116. Conversely, if at least one of the plurality of discrete particles 118 has one or more of a different size, shape, and material type than at least one other of the plurality of discrete particles 118, the particle film 116 may have a heterogeneous distribution of the plurality of discrete particles 118, wherein at least one of the size, shape, and material type of the plurality of discrete particles 118 varies throughout one or more dimensions of the particle film 116. The homogeneity or heterogeneity of the particle film 116 may be substantially undetectable by visual detection, but may be detectable by conventional spectroscopy or spectrometry techniques. In some embodiments, the particle film 116 has a homogeneous distribution of the plurality of discrete particles 118.

A plurality of interstitial spaces 120 may be present between portions of the plurality of discrete particles 118 and the non-planar surface 108 of the semiconductor device structure 100. In some embodiments, the plurality of interstitial spaces 120 may be empty voids in which no solid material or liquid material is present (although a gas, such as air, may be present). In additional embodiments, at least some of the plurality of interstitial spaces 120 may be at least partially filled with solid material or liquid material, such as one or more of a binder, a dispersant, and a surfactant. If present, the solid material or the liquid material may assist with the stabilization of the particle film 116. The interstitial spaces 120 may also include any surface modifications on the discrete particles 118.

A thickness of the particle film 116 may at least partially depend on the non-planar topography of the material 106 and the size and shape of each of the plurality of discrete particles 118. For example, if the top surface 114 of the recessed region 106b of the material 106 is relatively wide (e.g., greater than or equal to about 0.5 micrometer) and each of the plurality of discrete particles 118 has substantially the same size and shape, portions of the particle film 116 on the recessed region 106b of the material 106 may have substantially the same thickness as portions of the particle film 116 on the elevated region 106a of the material 106. As another example, if the top surface 114 of the recessed region 106b of the material 106 is relatively narrow (e.g., less than about 0.5 micrometer) and/or the plurality of discrete particles 118 includes multiple particle sizes and/or particle shapes, portions of the particle film 116 on the recessed region 106b of the material 106 may have a different thickness than portions of the particle film 116 on the elevated region 106a of the material 106. The thickness of the particle film 116 across the non-planar surface 108 may also depend upon the method used to form the particle film 116 on the non-planar surface 108. As shown in FIG. 1B, the particle film 116 may be a monolayer of the plurality of discrete particles 118. In additional embodiments, at least a portion of the particle film 116 may include multiple layers of the plurality of discrete particles 118.

With continued reference to FIG. 1B, the particle film 116 may be formed on the non-planar surface 108 of the semiconductor device structure 100 using a solution including the plurality of discrete particles 118 and at least one solvent. As used herein, the term "solution" means and includes a solution of the plurality of discrete particles 118 in the solvent, a suspension of the plurality of discrete particles 118 in the solvent, an emulsion of the plurality of discrete particles 118 in the solvent, or combinations thereof. Since a person of ordinary skill in the art will recognize whether a particular reference describes a solution, a suspension, an emulsion or a combination thereof from the context, for the purposes of readability and claiming the invention, the term "solution" refers collectively to a solution, a suspension, an emulsion, or a combination thereof. By way of non-limiting example, the at least one solvent may be a liquid in which the plurality of discrete particles 118 are at least partially soluble including, but not limited to, water or an organic solvent (e.g., an alcohol, such as ethanol, isopropanol, etc.). In some embodiments, the solvent is water. The solution may include a concentration of the plurality of discrete particles 118 sufficient to substantially cover at least the top surface 114 of the recessed region 106b of the material 106. The concentration of the plurality of discrete particles 118 in the solution may be tailored to the surface area and the surface chemistry of the material 106. The solution may include an excess of the plurality of discrete particles 118 relative to the available surface area of the non-planar surface 108. The plurality of discrete particles 118 in the solution may spontaneously interact with the non-planar surface 108. In some embodiments, the formation of the particle film 116 may terminate when there is no longer at least one exposed portion of the top surface 114 of the recessed region 106b of the material 106. Accordingly, the formation of the particle film 116 may be self-limiting. In additional embodiments, the formation of the particle film 116 may continue even if there is no longer at least one exposed portion of the top surface 114 of the recessed region 106b of the material 106.

The solution including the plurality of discrete particles 118 may be used to form the particle film 116 on the non-planar surface 108 of the semiconductor device structure 100 through a variety of processes including, but not limited to, at least one of a spin-coating process, a spray-coating process, an immersion-coating process, a vapor-coating process, and a soaking process. By way of non-limiting example, a spin-coating process may be used to form the particle film 116 on the non-planar surface 108 of the semiconductor device structure 100. The solution including the plurality of discrete particles 118 may, for example, be provided on at least a portion of the non-planar surface 108, and the semiconductor device structure 100 may be rotated at high speed (e.g., from about 20 to about 80 revolutions per second) to simultaneously spread the solution and remove (e.g., evaporate) the solvent. The semiconductor device structure 100 may continue to be rotated until the particle film 116 is formed on the non-planar surface 108.

By way of additional non-limiting example, a spray-coating process may be used to form the particle film 116 on the non-planar surface 108 of the semiconductor device structure 100. The solution including the plurality of discrete particles 118 may, for example, be sprayed through at least one nozzle to form the particle film 116 on the non-planar surface 108. The solvent may be removed (e.g., evaporated) as or after the solution exits the nozzle. The semiconductor device structure 100 may, optionally, be rotated during the spray-coating process.

As another non-limiting example, an immersion-coating process may be used to form the particle film 116 on the non-planar surface 108 of the semiconductor device structure 100. At least the non-planar surface 108 may be immersed in the solution including the plurality of discrete particles 118 for a sufficient period of time to form the particle film 116 on the non-planar surface 108. The immersion-coating process may be, for example, a Langmuir-Blodgett process wherein the solution includes one or more monolayers of the plurality of discrete particles 118 on or proximate a surface thereof. As the non-planar surface 108 is immersed in the solution, the one or more monolayers of the plurality of discrete particles 118 may be transferred from the solution to the non-planar surface 108.

As yet another non-limiting example, a vapor-coating process may be used to form the particle film 116 on the non-planar surface 108 of the semiconductor device structure 100. For example, the solution including the plurality of discrete particles 118 may be heated to above the boiling point of the solvent to form a vapor including the plurality of discrete particles 118, and the non-planar surface 108 may be exposed to the vapor (e.g., in a suitable containment vessel, such as a sealed pressure vessel) for a sufficient period of time to form the particle film 116 on the non-planar surface 108.

As yet still another non-limiting example, a soaking process may be used to form the particle film 116 on the non-planar surface 108 of the semiconductor device structure 100. The solution including the plurality of discrete particles 118 may, for example, be provided onto the non-planar surface 108 of the material 106 and may remain thereon for a sufficient period of time to form the particle film 116. The solution may be provided on the non-planar surface 108 prior to exposing the non-planar surface 108 to a separate CMP slurry. In additional embodiments, the solution may be the CMP slurry. Specifically, the solution may include the plurality of discrete particles 118, the solvent, and one or more conventional CMP process materials (e.g., chemically reactive material, abrasive particles, etc.). Accordingly, the solution may be formulated so that attractive forces between the non-planar surface 108 and the plurality of discrete particles 118 are greater than attractive forces between the non-planar surface 108 and other components (e.g., solvent, chemically reactive material, abrasive particles, etc.) of the solution. As the solution remains on the non-planar surface 108, the plurality of discrete particles 118 may separate and form the particle film 116. The soaking process may be performed prior to mechanically polishing (e.g., using a polishing pad) the non-planar surface 108.

The particle film 116 may be formed on the non-planar surface 108 of the semiconductor device structure 100 without performing an annealing process (e.g., a thermal anneal). Conventionally, an annealing process may be used to fuse a plurality of particles together and form a solid film on a non-planar surface prior to performing a CMP process. Omitting such an annealing process may maintain the particle film 116 as a configuration of discrete particles 118 on the non-planar surface 108. As compared to a conventional solid film, the plurality of discrete particles 118 may be more weakly adhered to the non-planar surface 108, which may facilitate planarizing the semiconductor device structure 100 using relatively fewer acts.

Referring collectively to FIGS. 1B and 1C, following the formation of the particle film 116 on the non-planar surface 108 of the semiconductor device structure 100, the semiconductor device structure 100 may be subjected to at least one CMP process to remove a portion of the material 106 (e.g., the elevated region 106a) and form planar surface 126 for the semiconductor device structure 100. In some embodiments, remaining material 106' may have substantially the same height $H_2$ as the recessed region 106b of the material 106. In additional embodiments, the remaining material 106' may have a different height, such as a height less than the height $H_2$ of the recessed region 106b of the material 106.

The CMP process may include polishing at least the material 106 using at least one CMP slurry and at least one polishing pad. The CMP slurry may, for example, include abrasive particles, at least one solvent (e.g., water), and at least one chemically reactive material (e.g., oxidizer) formulated to remove the material 106. The chemically reactive material may be more selective to the material 106 than the particle film 116. For example, the chemically reactive material may remove the material 106 at a rate that is at least about five times (5×) faster than removal rates for the particle film 116, such as about ten times (10×) faster, about twenty times (20×) faster, or about forty times (40×) faster. The CMP slurry may also be formulated to increase the adhesion strength of the particle film 116 to the non-planar surface 108 of the semiconductor device structure 100. For example, appropriately selecting a pH of the CMP slurry may increase electrostatic attractions between the particle film 116 and the non-planar surface 108. Due to the stronger interactions between the discrete particles 118 and material 106 on the recessed regions 106b and the decreased stress caused by the polishing pad, the particle film 116 may remain adhered to the top surface 114 of the recessed region 106b of the material 106 as the elevated region 106a of the material 106 is removed by the CMP process. The particle film 116 may be removed from the top surface 110 and the side surface 112 of the elevated region 106a of the material 106 as the elevated region 106a of the material 106 is removed by the CMP process. Accordingly, while present, the particle film 116 may prevent, by substantially limiting, removal of the recessed region 106b of the material 106.

Accordingly, a method of forming a planar surface for a semiconductor device structure may comprise forming a particle film comprising a plurality of discrete particles on a non-planar surface of the semiconductor device structure. The semiconductor device structure may be subjected to at least one chemical-mechanical polishing process after forming the particle film on the non-planar surface of the semiconductor device structure.

Furthermore, a method of forming a semiconductor device structure may comprise forming a material having a substantially non-planar topography over a substrate. A film comprising a plurality of discrete particles may be formed on exposed surfaces of the material. At least a portion of the film and at least a portion of the material may be removed.

Portions of the particle film 116 on the top surface 114 of the recessed region 106b of the material 106 may be removed by the CMP process, or may be removed after the CMP process. For example, in some embodiments, after removing a majority of the elevated region 106a of the material 106, the CMP process may remove the particle film 116 on the top surface 114 of the recessed region 106b of the material 106 using the at least one polishing pad. The adhesion strength of the particle film 116 may enable the particle film 116 to be removed from the top surface 114 of the recessed region 106b of the material 106 using relatively less down force as compared to removal of a conventional solid film, which may reduce stress on the semiconductor device structure 100. The same CMP slurry and polishing pad used to remove the elevated region 106a of the material 106 may be used to remove the particle film 116 from the top surface 114 of the recessed region 106b of the material 106, or at least one of a different CMP slurry and a different polishing pad may be used. If a different CMP slurry is used, the different CMP slurry may be formulated to decrease the adhesion strength of the particle film 116 to the semiconductor device structure 100. For example, the different CMP slurry may have a pH that decreases electrostatic attractions between the particle film 116 and the top surface 114 of the recessed region 106b of the material 106. If a different polishing pad is used, the different polishing pad may be a soft (i.e., buffing) pad.

In additional embodiments, the particle film 116 on the top surface 114 of the recessed region 106b of the material 106 may be removed after the CMP process, such as through exposure to a rinse including at least one material formulated to substantially weaken the adhesion strength (e.g., electrostatic interactions) between the particle film 116 and the material 106. For example, a water rinse, such as a deionized water rinse, may be used to remove the particle film 116 on the top surface 114 of the recessed region 106b. The water rinse may include a pH adjusting agent, such as an acid or a base, or a surfactant to facilitate in removing the particle film 116 on the top surface 114 of the recessed region 106b.

Following the formation of the planar surface 126, the semiconductor device structure 100 may be subjected to additional processing. By way of non-limiting example, at least one additional material (not shown) may be formed on or over the planar surface 126 of the semiconductor device structure 100. The at least one additional material may include at least one of a conductive material (e.g., a metal, a metal-containing material, a conductively doped material, etc.), a dielectric material (e.g., an electrically insulative oxide, an electrically insulative nitride, etc.), and a semiconductive material. The additional material may be formed using conventional processes, such as physical vapor deposition ("PVD"), chemical vapor deposition ("CVD"), or atomic layer deposition ("ALD"). PVD includes, but is not limited to, sputtering, evaporation, or ionized PVD. Such deposition processes are known in the art and, therefore, are not described in detail herein.

Figure 2A:
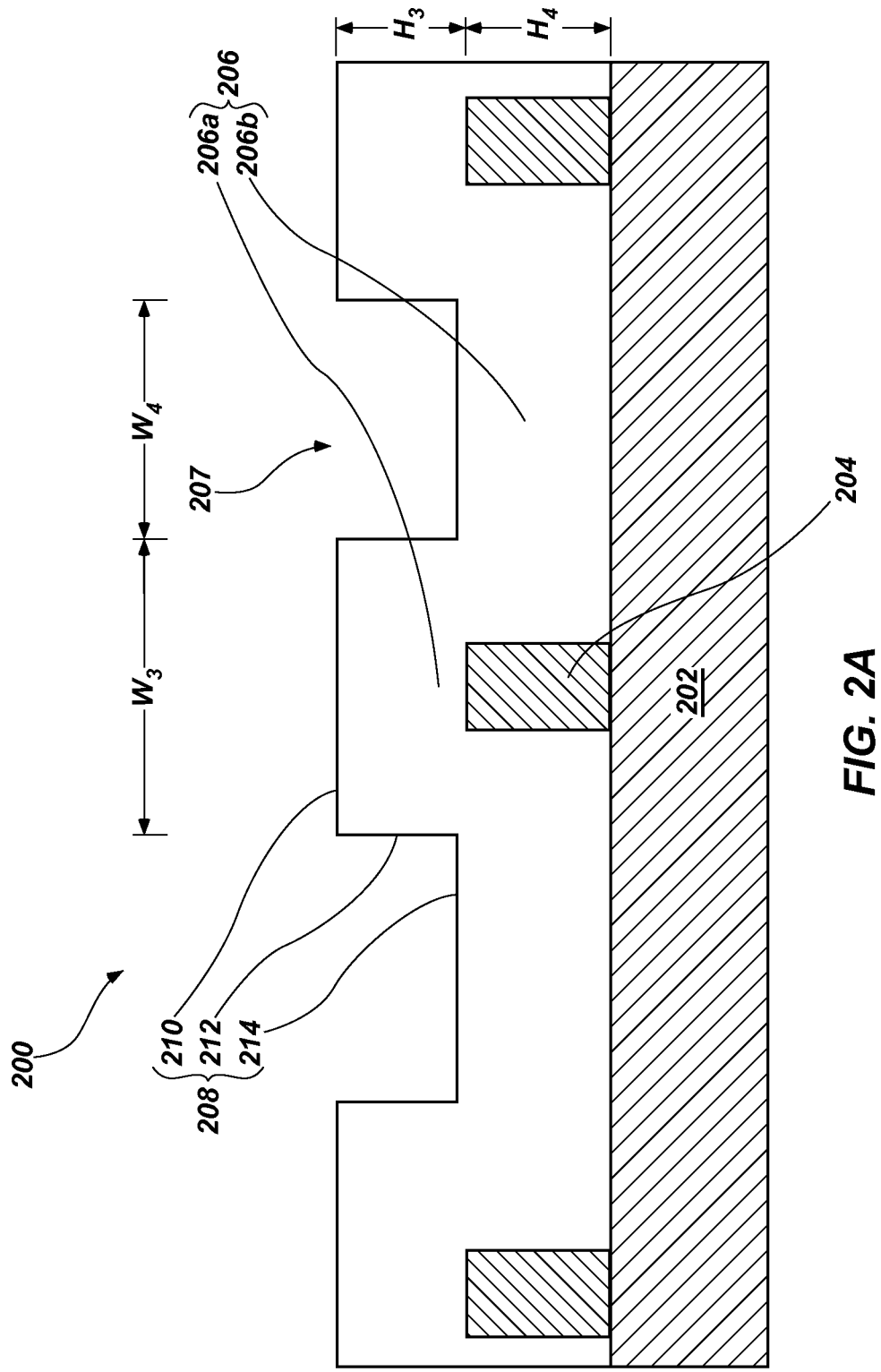
FIG. 2A through 2C are partial cross-sectional views of another semiconductor device structure and illustrate various stages of a method of forming a planar surface for the another semiconductor device structure in accordance with embodiments of the disclosure.
Figure 2B:
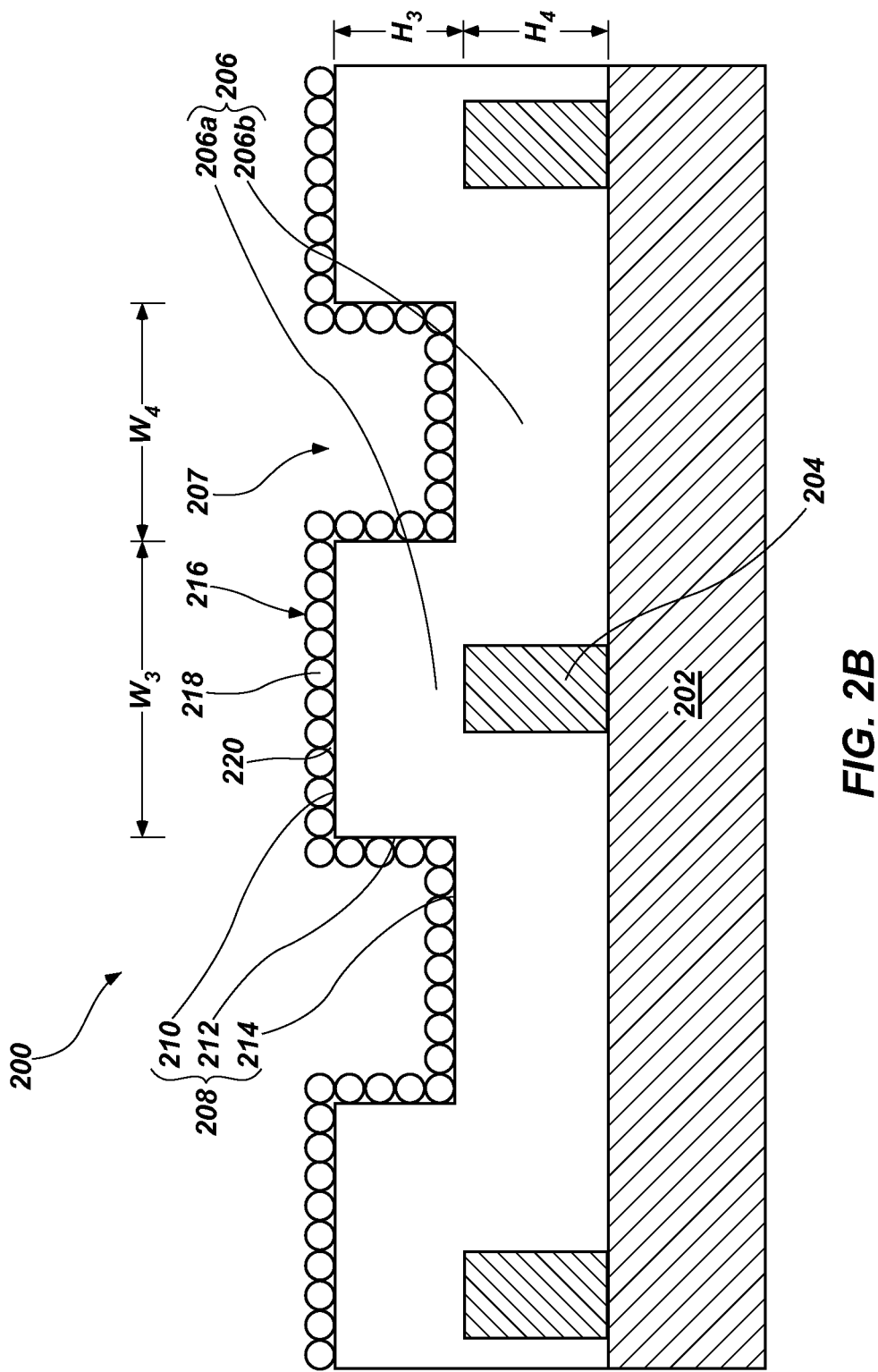
Figure 2C:
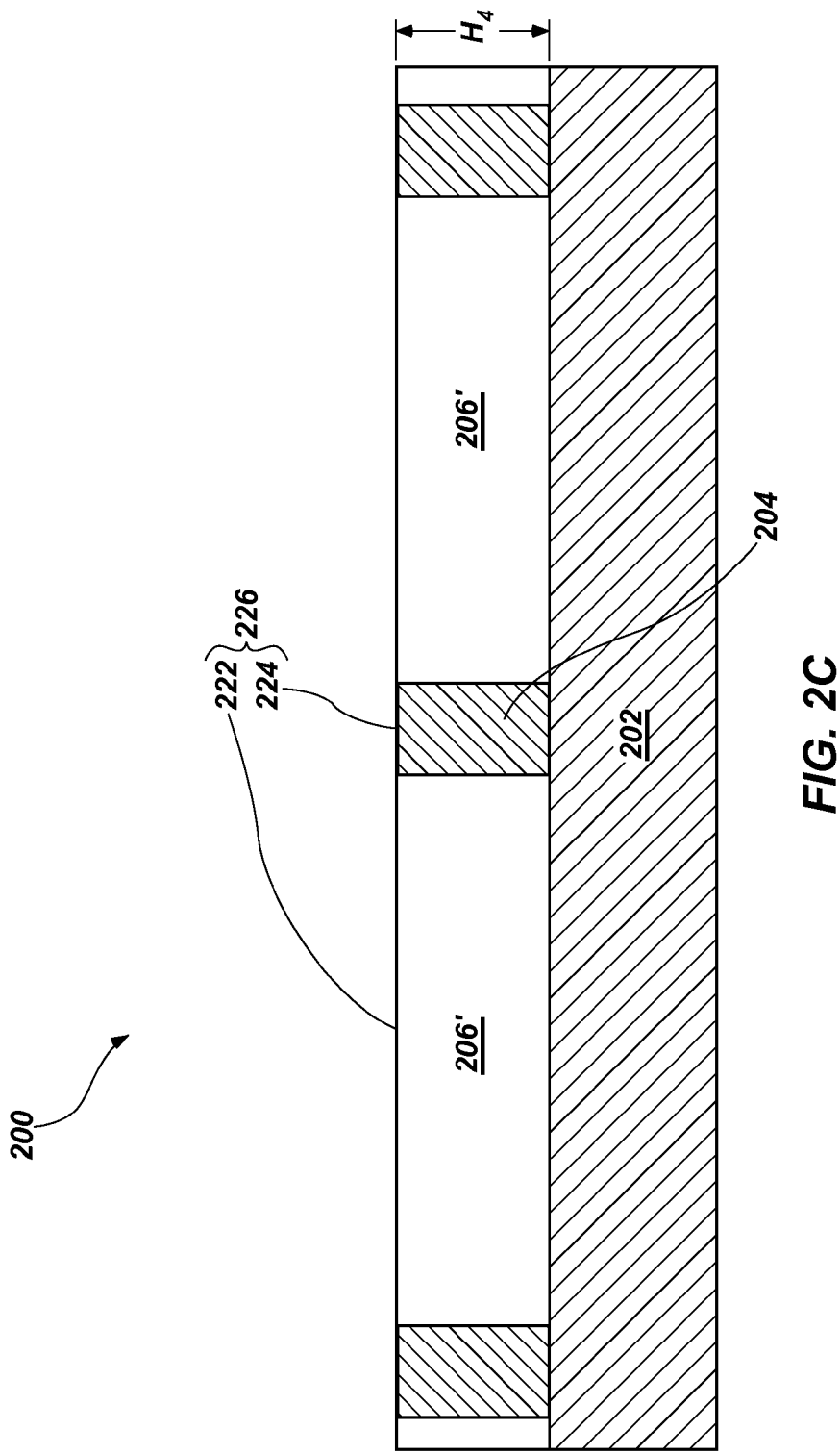

Referring to FIGS. 2A through 2C, the methods of the disclosure may be applicable to semiconductor device structures beyond those depicted in FIGS. 1A through 1C. By way of non-limiting example and referring to FIG. 2A, the methods of the disclosure may be used to form a planar surface for a semiconductor device structure 200 including a non-planar surface 208 including exposed surfaces of a material 206 overlying and surrounding at least one structure 204 over a substrate 202.

The structure 204 may be at least one of a dielectric structure, a conductive structure, and a semiconductive structure. For example, the structure 204 may be formed of and include a dielectric material, such as at least one of SiON, $Si_3N_4$, $SiO_2$, another dielectric oxide material, and a dielectric polymer material. As another example, the structure 204 may be formed of and include a conductive material, such as at least one of a metal, a metal alloy, a conductive oxide material, and a conductive polymer material. The structure 204 may have any desired shape and size. If the semiconductor device structure 200 includes more than one structure 204 (e.g., a plurality of structures 204), each of the structures may be the same (e.g., have the same shape, size, and material type), or at least one structure may be different (e.g., have a different shape, size, and/or material type). In addition, if the semiconductor device structure 200 includes more than one structure 204, adjacent structures may be spaced apart by at least one desired distance.

The material 206 may be a dielectric material (e.g., SiON, $Si_3N_4$, $SiO_2$, another dielectric oxide material, a dielectric polymer material, etc.), a conductive material (e.g., a metal, a metal alloy, a conductive oxide material, a conductive polymer material, etc.), or a semiconductive material (e.g., $Si_{1-x}Ge_x$, where x is, for example, a mole fraction between 0.2 and 0.8; Ge; GaAs; GaN; InP; etc.). The material 206 may be selected at least partially based on the material properties and purpose of the structure 204. As a non-limiting example, if the structure 204 is formed of and includes dielectric material, the material 206 may be a conductive material. As another non-limiting example, if the structure 204 is formed of and includes a conductive material, the material 206 may be a dielectric material.

The material 206 may conform to a topography of the structure 204 and the substrate 202. Accordingly, the material 206 may have a non-planar topography. For example, the material 206 may include at least one elevated region 206a overlying the structure 204 and at least one recessed region 206b overlying at least one portion of the substrate 202 laterally adjacent the structure 204. As depicted in FIG. 2A, in some embodiments, the material 206 includes a plurality of elevated regions 206a and a plurality of recessed regions 206b, wherein the plurality of elevated regions 206a and plurality of recessed regions 206b define a plurality of trenches 207. The size and shape of the structure 204 may thus at least partially define the topography of the material 206. For example, as shown in FIG. 2A, each of a width $W_3$ and a height $H_3$ of the at least one elevated region 206a, and a width $W_4$ and height $H_4$ of the at least one recessed region 206b may at least partially depend on the size and shape of the structure 204. In some embodiments, the width $W_4$ of the recessed region 206b is greater than or equal to about 0.5 micrometer ($\mu$m), such as greater than or equal to about 1 $\mu$m. The size and shape of each of the elevated region 206a and the recessed region 206b may define the non-planar surface 208 of the material 206. For example, as shown in FIG. 2A, the non-planar surface 208 of the material 206 may include a top surface 210 of the elevated region 206a, at least one side surface 212 of the elevated region 206a, and a top surface 214 of the recessed region 206b.

The semiconductor device structure 200, including each of the substrate 202, the structure 204, and the material 206 may be formed using conventional processes and equipment (not shown), which are not described in detail herein.

Referring to FIG. 2B, a particle film 216 may be formed on the non-planar surface 208 of the semiconductor device structure 200. The particle film 216 may be substantially similar to the particle film 116 previously described with reference to FIG. 1B. For example, the particle film 216 may include a plurality of discrete particles 218, with a plurality of interstitial spaces 220 between the discrete particles 218 and the non-planar surface 208, wherein the plurality of discrete particles 218 and the plurality of interstitial spaces 220 are respectively substantially similar to the plurality of discrete particles 118 and the plurality of interstitial spaces 120 previously described in relation to FIG. 1B. The plurality of discrete particles 218 may be directly attached to the non-planar surface 208 through one or more of the covalent interactions and the non-covalent interactions (e.g., electrostatic interactions, coordinative bonding, hydrogen bonding, π-π stacking interactions, van der Waals forces, etc.) previously described in relation to FIG. 1B. In some embodiments, the plurality of discrete particles 218 is directly attached to the non-planar surface 208 through non-covalent interactions. In addition, the particle film 216 may be formed on the non-planar surface 208 by way of one or more of the methods previously described in relation to FIG. 1B (e.g., a spin-coating process, a spray-coating process, an immersion-coating process, a vapor-coating process, a soaking process, etc.).

Referring collectively to FIGS. 2B and 2C, following the formation of the particle film 216 on the non-planar surface 208 of the semiconductor device structure 200, the semiconductor device structure 200 may be subjected to at least one CMP process to remove a portion of the material 206 (e.g., the elevated region 206a) and form a planar surface 226. By way of non-limiting example, as shown in FIG. 2C, the planar surface 226 may include an exposed top surface 222 of remaining material 206', and an exposed top surface 224 of the structure 204. In some embodiments, the planar surface 226 may be separated from a surface of the substrate 202 by the height $H_4$ (FIG. 2A) of the recessed region 206b of the material 206. In additional embodiments, the distance between the planar surface 226 and the surface of the substrate 202 may be different than the height $H_4$ of the recessed region 206b of the material 206, such as less than the height $H_4$ of the recessed region 206b of the material 206.

The CMP process may be substantially similar to the CMP process previously described in relation to FIGS. 1B and 1C. In addition, the particle film 216 may be removed from the top surface 214 of the recessed region 206b of the material 206 in a manner substantially similar to that previously described in relation to FIGS. 1B and 1C.

Accordingly, a method of forming a semiconductor device structure may comprise forming at least one structure over a substrate. A material may be formed over the at least one structure and the substrate, the material conforming to a topography of the at least one structure and the substrate. A particle film may be formed on the material. The particle film and the material may be subjected to a chemical-mechanical polishing process to form a planar surface.

Following the formation of the planar surface 226, the semiconductor device structure 200 may be subjected to additional processing. By way of non-limiting example, at least one additional material (not shown) may be formed on or over the planar surface 226 of the semiconductor device structure 200. The at least one additional material may be substantially similar to (and may be formed in substantially the same manner as) the at least one additional material previously described in relation to FIG. 1C.

The methods of the disclosure advantageously facilitate planarization of non-planar topographies of semiconductor device structures 100, 200 using less material and fewer processing acts as compared to conventional processes. The particle films 116, 216 of the disclosure may exhibit increased adhesion strength and provide superior protection to recessed regions 106b, 206b of materials 106, 206 during CMP processing as compared to methods utilizing films (e.g., liquid films) formed during the CMP processing. The methods of the disclosure may thus reduce dishing and increase planarization efficiency by enabling elevated regions 106a, 206a of the materials 106, 206 to be removed without substantially affecting heights $H_2$, $H_4$ of the recessed regions 106b, 206b (i.e., thereby enabling the recessed regions 106b, 206b to be formed at reduced heights relative to conventional processes that form the recessed regions 106b, 206b to greater heights to account for material removal from the recessed regions 106b, 206b during CMP processing). In addition, the particle films 116, 216 of the disclosure may exhibit reduced adhesion strength relative to solid films, which may facilitate forming the planar surfaces 126, 226 using at least one of fewer processing acts and fewer materials (e.g., a single CMP process, a single CMP slurry, etc.), and may reduce stress on the semiconductor device structures 100, 200. Accordingly, the methods of the disclosure advantageously enable the simple and efficient formation of planar surfaces 116, 226 for semiconductor device structures 100, 200 and semiconductor devices.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A method of forming a planar surface for a semiconductor device structure, comprising:
    forming a particle film comprising discrete particles on a non-planar surface of a material comprising at least one elevated region and at least one recessed region, the discrete particles attached at least to a surface of the at least one recessed region of the material without use of a binder material, adjacent particles of the discrete particles in contact with one another; and
    performing at least one chemical-mechanical polishing process to remove the particle film and the at least one elevated region of the material while retaining the at least one recessed region of the material.

2. The method of claim 1, wherein forming a particle film comprising discrete particles on a non-planar surface of a material comprises forming the discrete particles on the non-planar surface of the material through at least one of covalent interactions and non-covalent interactions.

3. The method of claim 2, wherein forming the discrete particles on the non-planar surface of the material through at least one of covalent interactions and non-covalent interactions comprises attaching the discrete particles to the non-planar surface of the material through at least one of electrostatic interactions, coordinative bonding, hydrogen bonding, π-π stacking interactions, and van der Waals forces.

4. The method of claim 2, wherein forming the discrete particles on the non-planar surface of the material through at least one of covalent interactions and non-covalent interactions comprises modifying at least one of the non-planar surface of the material and surfaces of the discrete particles to enhance the at least one of covalent interactions and non-covalent interactions.

5. The method of claim 1, wherein forming a particle film comprising discrete particles on a non-planar surface of a material comprises forming non-abrasive particles on the non-planar surface of the material.

6. The method of claim 5, wherein forming non-abrasive particles on the non-planar surface of the material comprises forming each of the non-abrasive particles to include a non-abrasive surface comprising a polymer material.

7. The method of claim 6, wherein forming each of the non-abrasive particles to include a non-abrasive surface comprising a polymer material comprises forming each of the non-abrasive particles as a composite particle comprising the polymer material encapsulating another material.

8. The method of claim 1, wherein forming a particle film comprising discrete particles on a non-planar surface of a material comprises forming discrete nanoparticles on the non-planar surface of the material.

9. The method of claim 1, wherein forming a particle film comprising discrete particles on a non-planar surface of a material comprises forming at least one particle of the discrete particles to include at least one of a different particle size, a different particle shape, and a different material type than at least one other particle of the discrete particles.

10. The method of claim 1, wherein forming a particle film comprising discrete particles on a non-planar surface of a material comprises forming the particle film to conform to and extend continuously across the non-planar surface of the material.

11. The method of claim 1, wherein forming a particle film comprising discrete particles on a non-planar surface of a material comprises forming the particle film to be non-conformal and discontinuous across the non-planar surface of the material.

12. The method of claim 1, wherein forming a particle film comprising discrete particles on a non-planar surface of a material comprises forming the particle film on the non-planar surface of the material without annealing the discrete particles.

13. The method of claim 12, wherein performing at least one chemical-mechanical polishing process further comprises exposing the material to at least one rinse formulated to decrease the adhesion strength between the particle film and the non-planar surface of the semiconductor device structure.

14. The method of claim 1, wherein performing at least one chemical-mechanical polishing process comprises exposing the particle film and the material to at least one chemical-mechanical polishing slurry formulated to enhance adhesion strength between the particle film and the non-planar surface of the material.

15. A method of forming a semiconductor device structure, comprising:
    forming a material having a non-planar topography over a substrate;
    forming a film on exposed surfaces of the material, the film comprising discrete particles attached at least to a surface of a recessed region of the material without use of a binder material, adjacent particles of the discrete particles in contact with one another; and
    removing all of the film and at least a portion of the material.

16. The method of claim 15, wherein forming a material having a non-planar topography over a substrate comprises forming the material to comprise at least one elevated region and at least one recessed region.

17. The method of claim 16, wherein forming the material to comprise at least one elevated region and at least one recessed region comprises forming the at least one recessed region to have a width of greater than or equal to about 0.5 micrometer.

18. The method of claim 15, wherein forming a film on exposed surfaces of the material comprises attaching the discrete particles to the exposed surfaces of the material through at least one of covalent interactions and non-covalent interactions, adjacent particles of the plurality of discrete particles in contact with one another.

19. The method of claim 15, wherein forming a film on exposed surfaces of the material comprises forming the film on the exposed surfaces of the material using at least one of a spin-coating process, a spray-coating process, an immersion-coating process, a vapor-coating process, and a soaking process.

20. A method of forming a semiconductor device structure, comprising:
    forming at least one structure over a substrate;
    forming a material over the at least one structure and the substrate, the material conforming to a topography of the at least one structure and the substrate;
    attaching a particle film comprising discrete particles to at least a surface of a recessed region of the material without using a binder material, adjacent particles of the discrete particles in substantial contact with one another; and
    subjecting the particle film and the material to a chemical-mechanical polishing process to form a planar surface.

21. The method of claim 20, wherein attaching a particle film comprising discrete particles to at least a surface of a recessed region of the material without using a binder material comprises attaching the discrete particles to exposed surfaces of the material, interstitial spaces located between portions of the discrete particles and the exposed surfaces of the material.

22. The method of claim 20, wherein the planar surface comprises a surface of the at least one structure and a surface of a remaining portion of the material.

* * * * *